United States Patent [19]
Bedard et al.

[11] Patent Number: 5,594,263
[45] Date of Patent: Jan. 14, 1997

[54] SEMICONDUCTOR DEVICE CONTAINING A SEMICONDUCTING CRYSTALLINE NANOPOROUS MATERIAL

[75] Inventors: Robert L. Bedard, Mc Henry, Ill.; Geoffrey A. Ozin; Homayoun Ahari, both of Toronto, Canada; Carol L. Bowes; Tong Jiang, both of Toronto, Canada; David Young, Toronto, Canada

[73] Assignee: UOP, Des Plaines, Ill.

[21] Appl. No.: 468,892

[22] Filed: Jun. 6, 1995

Related U.S. Application Data

[63] Continuation-in-part of Ser. No. 329,388, Oct. 26, 1994, abandoned, which is a continuation-in-part of Ser. No. 37,965, Mar. 26, 1993, abandoned.

[51] Int. Cl.$^6$ .......................... H01L 29/12; H01L 29/18; H01L 31/0328; H01L 31/109
[52] U.S. Cl. ................ 257/201; 257/3; 257/42; 257/43; 257/613; 257/616; 257/914
[58] Field of Search ................... 257/3, 40, 42, 257/43, 44, 76, 201, 613, 616, 914

[56] References Cited

U.S. PATENT DOCUMENTS

| | | | |
|---|---|---|---|
| 4,310,440 | 1/1982 | Wilson et al. | 252/435 |
| 4,440,871 | 4/1984 | Lok et al. | 502/214 |
| 5,013,337 | 5/1991 | Bedard et al. | 55/75 |
| 5,126,120 | 6/1992 | Bedard et al. | 423/305 |

OTHER PUBLICATIONS

Yousefi et al., "Electrical Contacts to Chalcogenide Single Crystals", Journal of Materials Science Letters, vol. 12, 1993, pp. 1447–1449.

*Primary Examiner*—Mahshid Saadat
*Assistant Examiner*—Alice W. Tang
*Attorney, Agent, or Firm*—Thomas K. McBride; Eugene I. Snyder; Frank S. Molinaro

[57] ABSTRACT

This invention relates to a semiconductor device comprising at least one p-n junction. The junction is formed from a "p" semiconductor contacting an "n" semiconductor. Said device characterized in that at least one of said "p" or "n" semiconductor is a nanoporous crystalline semiconducting material. These nanoporous materials have an intracrystalline nanopore system whose pores are crystallographically regular and have an average pore diameter of about 2.5 to about 30 Å. Additionally, they have a band gap of greater than 0 to about 5 eV which band gap can be modified by removing a portion of the templating agent from the pore system of the materials. The materials which have these properties include, metal polychalcogenide compounds, metal sulfides and selenides, metal oxides, and metal oxysulfides. These materials can be used in a large variety of semiconducting devices such as light emitting diodes, bipolar transistors, etc. A process for preparing these nanoporous materials is also presented.

12 Claims, 2 Drawing Sheets

SEMICONDUCTOR DEVICE CONTAINING A SEMICONDUCTING CRYSTALLINE NANOPOROUS MATERIAL

CROSS REFERENCE TO RELATED APPLICATION

This application is a continuation-in-part of application, U.S. Ser. No. 08/329,388 filed Oct. 26, 1994, now abandoned, which in turn is a continuation-in-part of U.S. Ser. No. 08/037,965 filed Mar. 26, 1993, now abandoned, all of which is hereby incorporated.

FIELD OF THE INVENTION

This invention generally relates to semiconductor devices which have at least one p-n junction. Either the "p" or "n" (or both) semiconductors is a nanoporous semiconducting crystalline material. The nanoporous material is characterized in that it has an intracrystalline nanopore system whose pores are crystallographically regular and have an average pore diameter of about 2.5 Å to about 30 Å, and a band gap of greater than 0 to about 5 eV.

BACKGROUND OF THE INVENTION

Semiconductor materials are used in numerous electronic applications including computers, sensors, and process control instrumentation. Increasing the speed of computers has necessitated the fabrication of increasingly smaller components coupled with the application of optical elements to more and more aspects of computer design. These technological prerequisites, as well as the need for better and more versatile sensors and process-control instrumentation, have brought with them requirements for semiconducting components with new or enhanced functionalities. The technological demands of high-speed computers have led to the development of techniques such as micromachining, vapor phase epitaxy, and nano-lithography, which allow the fabrication of increasingly smaller structures whereby bulk materials are engineered to provide submicron scale objects. Unfortunately, the technology required for molecule-discriminating devices such as sensors has not developed to the same advanced level. Most present-day molecule-discriminating devices contain one or more components composed of porous sintered aggregates of bulk semiconductors such as $ZrO_2$ and $SnO_2$. These materials have been described in the semiconducting art as "microporous", which describes the average dimensions of the random network of pores contained between the grains of the partially sintered component.

The term "microporous" has also been used in the semiconductor art to describe silicon metal that has been anodically etched in hydrofluoric acid so that only filamentous regions of nanometer dimensions remain. For example, Lehmann and Gösele describe the preparation of porous silicon. See *Adv. Mater.* 4(2), pp. 114–116 (1992). Evidence suggests that quantum confinement of electrons takes place in these silicon nanofilaments. Quantum confinement in semiconductors allows applications in LEDs, superlattice and quantum well lasers and other devices.

Applicants have taken a different approach to the design of new semiconducting functionalities which involves the use of crystalline materials that are nanoporous. By nanoporous is meant a material which has a crystallographically regular intracrystalline pore system whose pores have an average diameter of 2.5 to about 30 Å. Zeolites are the best known nanoporous materials. Zeolites are materials which have a three-dimensional framework structure composed of aluminum, silicon, and oxygen and an intracrystalline pore system. The intracrystalline pore system may have pores in one, two or three crystallographic directions. The unique feature of these materials is that the pores in any one direction are crystallographically ordered. Other examples of crystalline nanoporous materials include aluminophosphates, silicoaluminophosphates, germanium and tin-based metal sulfides and selenides, and zinc phosphates. See U.S. Pat. Nos. 4,310,440; 4,440,871; 4,880,761 and 5,126,120, respectively.

Applicants have found that a subclass of these molecular sieves have semiconducting properties. In particular, they are characterized in that they have an optical band gap of greater than zero to about 5 eV. Because of their nanoporosity, these semiconducting materials can be used in molecule discriminating electronic and optoelectronic devices (as well as other electronic and optoelectronic devices), in which a conventional semiconductor is replaced by a nanoporous structure to allow a molecule discriminating electronic or optical response to the presence of physisorbed and chemisorbed molecular and ionic species.

The effects of physisorbed species on the electronic properties of a dense semiconductor is usually negligible. The attractive forces involved in physisorption are generally of the dipole and induced-dipole type and usually follow simple Lennard-Jones $r^{-6}$ energy dependence. The adsorbing surface will undergo some slight polarization with minimum penetration into the adsorbent. Physisorption within a nanoporous semiconductor induces a polarization that will affect the electronic properties to a much greater magnitude than any bulk or microcrystalline semiconductor. A nanoporous semiconductor is in principal a three-dimensional surface that is only a few atoms thick between adsorption sites in adjacent void spaces. The volume percent of this type of semiconductor that is polarized is essentially proportional to the fraction of the atoms that are on the intracrystalline surface. The net effect of physisorption is a magnification of the polarization relative to dense semiconductors and a corresponding perturbation of the electronic properties.

Electronic perturbations will also occur in acid-base types of interactions or in electrostatic ion-dipole and ion-quadrupole interactions between adsorbates and nanoporous semiconductors. The semiconductor/adsorbate interactions outlined here would perturb the electronic properties of a nanoporous semiconductor in a measurable way.

Because of the weak or negligible electronic effects of physisorption in traditional dense, microcrystalline semiconductors, the materials have only been used in sensing devices where chemisorption or ionosorption takes place. The electrical properties of semiconductors can be profoundly affected by the presence of chemisorbed or ionosorbed species at the surface. The main reason for these effects is the limited number of charge carriers in intrinsic semiconductors and the resulting deep penetration of the space-charge layer when carders are trapped at the surface by chemisorbed electron acceptors or donors. The space-charge layer (the depth of which is called the Debye Length) arises from the transfer of charge to or from the chemisorbed molecule and the resulting potential radient that extends from the surface into the semiconductor. The Debye Length is usually characterized as the penetration depth corresponding to a potential barrier of 1/e times the surface potential value.

The Debye Length for semiconductors with band gaps of greater than 0.8 eV will be at least 5.6 Å. Larger band gap materials, a category that includes many nanoporous chalcogenides, will display much larger Debye Lengths of the space charge layer as a result of chemisorption. The Debye Length of a space charge layer associated with appreciable chemisorption would penetrate the entire volume of a nanoporous semiconducting material.

Sintered polycrystalline compacts of dense semiconductors, such as $SnO_2$, are widely used as combustible gas sensors. Polycrystalline compacts are used to maximize the amount of surface in contact with the atmosphere. The principal of operation is the conductance response to ionosorption of $O_2$ (to form $O_2^-$) and the effect of reducible gases on the amount of adsorbed $O_2$. The response of these semiconducting sensors is extremely dependent on the device fabrication technique and aging of the $SnO_2$. Theoretical models for the function of these porous semiconducting sensors are based on random barrier networks and Schottky barrier conduction.

Random barrier networks are associated with the conductivity through variable radius intergrain "necks", formed during the sintering of the compacts. See, P. Romppainen and V. Lantto, *J. Appl. Phys.*, 63, (1988), 5159–5165. The Schottky barrier model is characterized by surface potential barriers caused by $O_2$ adsorption between the $SnO_2$ grains. See, J. F. McAleer, P. T. Moseley, B. C. Tofield, and D. E. Williams, *Bri. Ceram. Proc.*, 1985, 89–105. The electric conductivity is therefore a function of grain boundary characteristics in the Schottky model. Both of these models predict a drastic dependence of the device performance on the sintered microstructure of the semiconducting component.

Nanoporous semiconductors do not have a random network of barriers and their electrical response would be large enough to preclude the necessity for a large external surface area. The interconnections between secondary building units are crystallographically regular, rather than random, and are a function of the framework topology rather than the fabrication history. A sensing device could be based on a single crystal of a nanoporous semiconductor. Besides the advantage of miniaturization, nanoporous semiconductors can be used to detect or discriminate physisorbed species as well as chemisorbed species, because of the magnitude of the sorption-induced electronic effects.

The nanoporous materials which possess semiconducting properties include the chalcogenide (sulfur, selenium, or combinations thereof) materials described in U.S. Pat. No. 4,880,761 and the oxysulfide materials of U.S. Pat. No. 5,122,357. Other materials are polychalcogenides (sulfur and selenium) compounds of group VIII, IIB, IIIB, IVB and VB of the Periodic Table of the Elements, as well as metal oxides hollandite, psilomelane, and todorokite pore structures, or intergrowths of the structures.

The above-named materials can be prepared hydrothermally with the aid of a structure-directing cation, by solid state high temperature methods or in molten salt media. After crystallization, these nanoporous materials will contain at least some structure directing agent or cations in the intracrystalline pore system. Applicants have found that the band gap of these materials can be modified by changing the concentration of the structure-directing agent present in the nanoporous material.

The art contains reports of "framework" materials that have semiconducting properties. For example, S. Dhingra and M. G. Kanatzidis in *Science*, Vol. 258, pp. 1769–72 (1992) report that materials such as $(Ph_4P)(M)(Se_6)_2$ have semiconducting properties. There are also reports of various metal oxides with the hollandite structure having semiconducting properties. These are: 1) *Mat. Res. Bull.*, 25, 139–148 (1990); 2) *Mat. Res. Bull.*, 18, 203–210 (1983); and 3) *J. Mater. Chem.*, 2(10), 993–996 (1992).

Finally, U.S. Pat. No. 5,151,110 discloses using zeolites to adsorb chemical entities which gives rise to a mass change which change is detected by a piezoelectric substrate.

SUMMARY OF THE INVENTION

As stated, this invention deals with a semiconductor device containing a nanoporous material. One specific embodiment of the invention is a semiconductor device comprising at least one p-n junction, said junction formed from a "p" semiconductor contacting an "n" semiconductor, where at least one of said "p" or "n" semiconductor is a nanoporous semiconducting crystalline material having a crystallographically ordered nanoporous framework structure, an intracrystalline pore system whose pores have an average pore diameter of about 2.5 to about 30 Å and a band gap of greater than zero to about 5 eV said material selected from the group consisting of a metal sulfide or selenide having an empirical formula expressed in molar ratios: $xR:MA_{2\pm0.2}:zH_2O$ where x has a value of greater than 0 to about 1.0, R represents at least one organic structure-directing agent present in the intracrystalline pore system, M is germanium, tin, or combinations thereof, A is sulfur, selenium, or combinations thereof, z has a value of about 0 to about 4.0; a metal sulfide or selenide having the empirical formula $xR:M_{1-y}M'_yA_{2\pm0.2}:zH_2O$ where x has a value of greater than 0 to about 1.0, R represents at least one organic structure-directing agent present in the intracrystalline pore system, M is germanium, tin, or combinations thereof, y varies from greater than 0 to about 0.5, M' is a metal selected from the group consisting of thallium, silver, lead, mercury, chromium, arsenic, antimony, indium, molybdenum, tungsten, cobalt, zinc, copper, manganese, iron, nickel, cadmium and gallium, A is sulfur, selenium, or combinations thereof, z has a value of about 0 to about 4.0; and a metal oxysulfide composition having the empirical formula

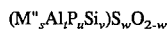

where M" is selected from the group consisting of cobalt, tin, zinc, iron, chromium, manganese, germanium, gallium and arsenic, s is the mole fraction of M" and varies from greater than zero to about 1, t is the mole fraction of Al and varies from 0 to less than 0.5, u is the mole fraction of P and varies from 0 to about 0.5, v is the mole fraction of Si and varies from 0 to less than 0.5, w is the mole fraction of S and varies from greater than zero to about 2s and t, u and v are chosen such that when t is greater than zero, u is greater than zero and s+t+u+v=1 and the n semiconductor is a conventional n doped semiconductor selected from silicon, germanium, a III-V semiconductor and a II-VI semiconductor.

Another embodiment of the invention is a process for preparing a crystalline nanoporous material having an empirical formula expressed in molar ratios: $xR:MA_{2\pm0.2}:zH_2O$ where x has a value of greater than 0 to about 1.0, R represents at least one organic structure-directing agent present in the intracrystalline pore system, M is germanium or tin, A is sulfur, selenium, or combinations thereof, z has a value of about 0 to about 4.0, the process comprising forming a reaction mixture having the composition, expressed in terms of molar ratios of: $1RD:M:qA:mH_2O$ where 1 has a value of about 0.25 to about 5, m has a value of about 12 to about 1000, q has a value of about 0.5 to about 10, D is an anion, at a temperature, pressure and time sufficient to form the crystalline composition, the process characterized in that the source of M is freely divided germanium, tin, or combinations thereof and the source of A is elemental sulfur, selenium, or combinations thereof.

This and other objects and embodiments will become more apparent after a more detailed description of the invention.

DETAILED DESCRIPTION OF THE INVENTION

Figure 1:
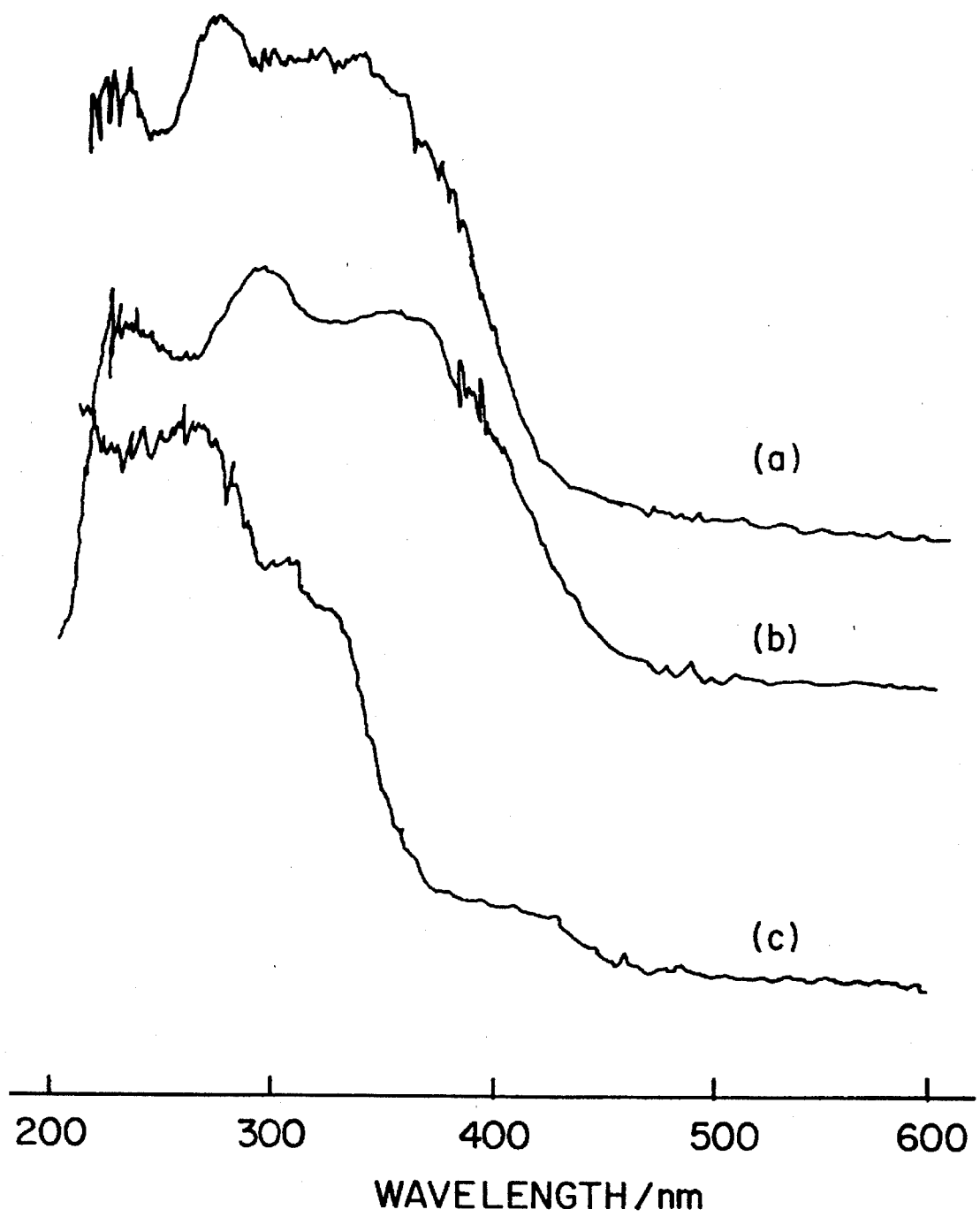
FIG. 1 presents three UV reflectance spectra for: a) SnS-1; b) SnS-4; and c) ZnSnS-4.

As stated above, this invention deals with nanoporous materials useful as a semiconductor in electronic devices and a process for modifying the band gap of these materials. Accordingly, one necessary component of this invention is a semiconducting nanoporous material. These materials are selected from the group consisting of metal polychalcogenides, metal oxides having the hollandite, psilomelane, todorakite structures or intergrowth of those structure, metal sulfide or selenide compounds and metal oxysulfide compounds. All of these materials are characterized in that they have a crystallographically-ordered nanoporous framework structure in which the cationic atoms (metals) are connected by bridging anionic species, i.e., sulfur, selenium, polysulfide, polyselenide, or oxygen. These materials have an intracrystalline pore system whose pores have an average pore diameter of about 2.5 to about 30 Å. Most of these materials contain at least one structure directing agent in its pores.

One group of nanoporous materials has the empirical formula expressed as  where x has a value of greater than 0 to about 1.0, R represents at least one organic structure-directing agent present in the intracrystalline pore system, M is germanium, tin, or combinations thereof, A is sulfur, selenium, or combinations thereof, z has a value of about 0 to about 4.0. These materials are described in U.S. Pat. No. 4,880,761 which is incorporated by reference. As described in the '761 patent, these materials are synthesized by hydrothermal crystallization for an effective time at an effective pressure and temperature from a reaction mixture containing a reactive source of the metal, e.g., metal sulfide or selenide, a structure directing component, water and/or an organic solvent and an anion, e.g., bisulfide, hydroxide, etc. The structure directing agent can be a compound of an element of Group VA of the Periodic Table of the Elements, particularly nitrogen, phosphorus, arsenic and antimony, preferably nitrogen or phosphorus and most preferably nitrogen where such compounds also contain at least one alkyl or aryl group having from 1 to 8 carbon atoms. Polymeric quaternary ammonium salts such as $[(C_{14}H_{32}N_2)(OH)_2]_x$ wherein "x" has a value of at least 2 are also suitably employed. The mono-, di- and triamines are advantageously utilized, either alone or in combination with a quaternary ammonium compound or other structure-directing compound. Mixtures of two or more structure-directing agents can either produce mixtures of the desired metal sulfides or the more strongly directing structure-directing species may control the course of the reaction with the other structure-directing agents serving primarily to establish the pH conditions of the reaction mixture. Representative structure-directing agents include: tetramethylammonium ions, tetraethylammonium ions, tetrapropylammonium ions, tetrabutylammonium ions, tetrapentylammonium ions, di-n-propylamine, ethylbutylamine, tripropylamine, triethylamine, triethanolamine, piperidine, cyclohexylamine, 2-methylpyridine, N,N-dimethylbenzylamine, N,N-dimethylethanolamine, choline, N,N'-dimethylpiperazine, 1,4-diazabicyclo(2,2,2,)octane, N-methyldiethanolamine, N-methylethanolamine, N-methylpiperidine, 3-methylpiperidine, N-methylcyclohexylamine, 3-methylpyridine, 4-methylpyridine, quinuclidine, N,N'-dimethyl-1,4-diazabicyclo(2,2,2,)octane ion, di-n-butylamine, neopentylamine, di-n-pentylamine, diisopropylamine, t-butylamine, ethylenediamine, pyrrolidine, 2-imidazolidone, piperazine, hexane-1,6-diamine, decylamine, decane-1,10-diamine, hexamethylenetetraamine, and adamantanamine.

Another process used to prepare the metal sulfide/selenide nanoporous materials is to use the metal and sulfur, selenium, or combinations thereof in their elemental states. In this case a reaction mixture is prepared which has the composition, expressed in terms of molar ratios of:

$$kRD:M:qA;mH_2O$$

where k has a value of about 0.25 to about 5.0, m has a value of about 12 to about 1000 and q has a value of about 0.5 to about 10. The anion D is selected from the group consisting of $OH^-$, $SH^-$, $HCO_3^-$, $F^-$, and $S_x^{-2}$ (x=1 to 8). For example, finely divided tin can be slurried with a quaternary ammonium compound such as tetramethylammonium hydroxide and mixed with finely divided sulphur or selenium. The resulting mixture is then heated at a reaction temperature of about 50° C. to about 200° C. for a time of about 2 to about 700 hours under autogenous pressure to give the desired nanoporous material. This process has the advantage that simpler materials can be used as the starting materials versus the metal sulfide or selenide materials used in the '761 patent. Applicants have aim found that this process yields products having large crystals on the order of 100 micrometers to about 4 mm. It has also been found that after reaction is complete, if the mixture is slowly cooled from the reaction temperature to room temperature at a cooling rate from about 1° to about 30° C./hour, larger crystals are obtained.

A subclass of the metal sulfide or selenides described above are those having the empirical formula

where y varies from greater than 0 to about 0.5 and M' is a metal selected from the group consisting of thallium, silver, lead, mercury, chromium, arsenic, antimony, indium, molybdenum, tungsten, cobalt, zinc, copper, manganese, iron, nickel, cadmium and gallium. These materials are also described in U.S. Pat. No. 4,880,761 which states that the M' metal is one that meets the criteria: 1) occurs in sulfide or selenide minerals of hydrothermal origin; b) exhibits stable aqueous thiometallate or selenometallate chemistry or forms stable bisulfide or biselenide complexes and c) gives a minimum framework charge from about 0 to about −1 per metal atom in a $M_{1-y}M'_yA_{2\pm 0.2}$ framework structure. Illustrative of the metals which meet these criteria are thallium, silver, lead, mercury, chromium, arsenic, antimony, indium, molybdenum, tungsten, cobalt, zinc, copper, manganese, iron, nickel, cadmium and gallium. Preferred metals may be selected from the group consisting of molybdenum, tungsten, arsenic, antimony, indium, cobalt, zinc, manganese, iron, nickel, copper, cadmium and gallium, while especially preferred metals may be selected from the group consisting of cobalt, zinc, manganese, iron, nickel, copper, cadmium and gallium. The method of preparing these materials are also presented in the '761 patent.

Metal oxysulfide compositions are another class of compounds which are useful as semiconductors. These materials are described in U.S. Pat. No. 5,122,357 which is incorporated by reference. As stated in the '357 patent these materials are described by the empirical formula $$(M''_t Al_s P_u Si_v)S_w O_{2-w}$$

where M'' is at least one metal selected from the group consisting of metals which: 1) can be incorporated into the framework structure of a microporous molecular sieve and 2) form hydrolytically stable sulfides; s is the mole fraction of Al and varies from 0 to less than 0.5, u is the mole fraction of P and varies from 0 to about 0.5, v is the mole fraction of Si and varies from 0 to less than 0.5, w is the mole fraction of S and varies from greater than zero to about 2s and t, u and v are chosen such that when t is greater than zero u is greater than zero and s+t+u+v=1. Illustrative of the M'' metals are cobalt, tin, zinc, iron, chromium, manganese, germanium, gallium and arsenic.

Examples of polychalcogenide compounds which can be used in this invention are the polyselenide compounds having the formula $(Ph_4P)M1(Se_6)_2$ where Ph represents a phenyl group and M1 is gallium, indium or thallium. These materials have been described by S. Dhingra and M. G. Kanatzidis, *Science*, Vol. 258, pp. 1769–1772 (1992). This reference also describes the preparation of these materials which involves mixing the metal (in elemental form) with $(Ph_4P)_2Se_5$ and elemental selenium, heating the mixture at about 200° C. for about 2 days to obtain the desired products.

Finally, metal oxides with the hollandite, psilomelane or todorokite structure as well as intergrowth of these structures can be used. The metals may be selected from the group consisting of manganese, molybdenum, titanium, germanium, rhenium, zirconium, tin, antimony, aluminum, scandium, gallium, ruthenium, indium, chromium, iron, magnesium, cobalt, nickel, lithium and mixtures thereof. Examples of these materials are: $Ba_{3a}Li_{(2a+4b)}Ti_{(8-2a-b)}O_6$ where $0.32<a<0.42$ and $0<b<0.20$; $Cs_cTiO_2$ where $0.125<c<0.22$; $K_{1.8}M2_{0.9}Ti_{7.1}O_{16}$ where M2 is aluminum, chromium, iron, magnesium, cobalt and nickel; $(Mg_{0.77}Na_{0.03})(Mg_{0.18}Mn^{+2}_{0.60}Mn^{+4}_{5.22})O_{12} \cdot 3.07 \; H_2O$. The synthesis of these materials is reported in the following references: *J. Mater. Chem.*, 2(10), 993–996 (1992); *Mat. Res. Bull.*, 25, 139–148 (1990); *Mat. Res. Bull.*, 18, 203–210 (1983); *Science*, 231, 717–719 (1986).

As stated, these nanoporous materials act as semiconductors. The band gap of these materials can vary from greater than 0 to about 5 eV and preferably from greater than 0 to about 3.5 eV. This band gap can be tuned or changed by varying the concentration of the structure-directing agent or by exchanging or replacing the structure-directing agent with mixtures of other cations and space-filling moieties, such as organic or inorganic cations and amines, alcohols, glycol, and water. Thus, the concentration of the structure-directing agent can be decreased by heating the nanoporous material at a temperature of about 50° C. to about 350° C. for a time of about 1 hr. to about 96 hr. Preferably the heating should be done under vacuum.

The types of semiconducting devices in which the nanoporous materials of this invention can be used are well known in the art. Examples of these devices include doped and Schottky barrier diodes; light emitting diodes (LEDs); solar cells; tunnel diodes; photo diodes; bipolar transistors; field effect transistors (FETs); semiconductor-controlled rectifiers (SCRs); bilateral diode and triode switches (TRIACs); acoustic wave devices; semiconducting lasers; single and multiple quantum well and surface emitting lasers; semiconducting conductometric sensors; FET-based chemical sensors; self-elecro-optic-effect (SEED) devices.

In these devices the nanoporous material can be the "p" semiconductor with the "n" semiconductor being a conventional semiconductor. Alternatively the "n" semiconductor can be the nanoporous material while the "p" semiconductor is a conventional semiconductor. Finally, the nanoporous material can be both the "p" and the "n" semiconductor. It is understood that in this situation the nanoporous material which is the "p" semiconductor is different from the one which is the "n" semiconductor. The conventional semiconductors which can be used in these semiconductor devices are any of those well known in the art, examples of which are silicon, germanium, a III-V semiconductor and II-VI semiconductor. Specific examples of III-V semiconductors include GaAsInP and GaP. Specific examples of II-VI semiconductors include CdSe, CdTe and HgTe.

In terms of actually fabricating the device, one way this can be done is by depositing one or more layers of conventional semiconductors and conductor contact points on one or more single crystals or thin film of nanoporous semiconductors. See, e.g., G. H. Yousefi and M. K. Agarwal, *J. Mat. Sci. Let.*, 12, pp. 1447–1449 (1993).

The nanoporous materials of this invention can be used in a process for detecting the presence of molecular species in an environment. For example, the humidity or $CO_2$ level in a room or a gas stream can be monitored by using crystals of SnS-1 (SnS-1 is nomenclature for tin sulfide structure type 1 as set forth in U.S. Pat. No. 4,880,761). The process involves placing a molecular discriminating sensor in an environment which environment contains several molecular species, e.g., water, carbon dioxide, carbon monoxide, volatile organic compounds, etc. The molecule discriminating sensors comprise at least one nanoporous material which selectively adsorbs at least one molecular species. This selective adsorption is based either on the size of the molecular species or on the polarity of the molecular species. Selective adsorption using nanoporous materials is described in U.S. Pat. No. 5,013,337 which is incorporated by reference.

As stated earlier, the adsorption of molecular species by the nanoporous materials of this invention gives rise to a change in the optical and/or electronic properties of the material. This change can be detected by means well known in the art, and which means are attached to the molecule discriminating sensor. Together, the sensor and means for detecting changes in the sensor make up a molecule discriminating device. For example, a single crystal of the nanoporous semiconductor SnS-1 can be connected by leads placed directly on the crystals to an electrical circuit capable of detecting changes in conductivity. This molecule discriminating device can then be placed in an environment and used to monitor humidity or $CO_2$ levels. The $CO_2$ or water will be adsorbed by the SnS-1 crystal which then changes the conductivity of the SnS-1 crystal and which change is detected by the electronics associated with the device.

Examples of other molecular species which can be detected by the process of this invention include $H_2S$, COS, arsine, phosphine, oxygen, hydrocarbons, etc.

EXAMPLE 1

The procedures found in U.S. Pat. No. 4,880,761 were used to prepare SnS-1 (Ex. 20a), SnS-4 (Ex. 23a) and ZnSnS-4 nanoporous molecular sieves. The procedure involved mixing freshly precipitated tin sulfide with an aqueous solution of tetramethylammonium bicarbonate or tetrapropylammonium hydroxide, and then heating the mixture at 150° C. under autogeneous pressure. The composition of the reaction mixtures expressed as molar oxide ratios were:

A) $TMAHCO_3$:$SnS_2$:33 $H_2O$ (7 day reaction time)

B) TPAOH:$SnS_2$:84 $H_2O$ (16 hours reaction time

C) TPAOH:$SnS_2$:0.01 $Zn(CH_3COO)_2$:84 $H_2O$ (89 hours reaction time)

Mixtures A, B and C gave products which were identified as SnS-1, SnS-4 and ZnSnS-4 respectively, by x-my diffraction analysis.

These three samples were analyzed by UV reflectance spectroscopy to determine if they have optical band gaps in the semiconducting range. The absorption edge in the reflectance spectrum is used to determine the band gap. See, *Phys. Stat. Sol.*, 38, 363–367 (1970). The spectra of SnS-1, SnS-4 and ZnSnS-4 are presented in the Figure, and are labeled as (a), (b) and (c) respectively.

EXAMPLE 2

A series of tin-sulfide/selenide nanoporous materials were prepared. All of these materials had the x-my diffraction pattern of structure type 1 (SnS-1). These materials were prepared from a reaction mixture having the following formula:

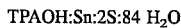

where t=2.0, 1.5, 1.0, 0.0.

The tin source was finely divided tin, while the sulfur source was finely divided sulfur. Each mixture was placed in a Teflon®-lined stainless steel reactor and heated at about 150° C. under autogenous pressure for a time of 4 to 18 days. At this time the reactor was cooled and the product suction filtered and washed with water and acetone. X-ray powder diffraction analysis of the products revealed the presence of nanoporous fin chalcogenide structure type 1 as indicated in U.S. Pat. No. 4,880,761. Analytical data, summarized in Table 1, was acquired by quantitative SEM-EDX measurements. The empirical formula of these four materials was found to be: SnS-1, $SnS_{0.43}Se_{0.57}$-1, $SnS_{0.22}Se_{0.78}$-1, SnSe-1.

These materials were analyzed by UV-Visible reflectance spectroscopy and band gap energies computed which are presented in Table 1. The nature of the band gap can be measured using reflectance spectroscopy and a suitable light source, by determining the absorption edge and the functional dependence of the absorption coefficient on the photon energy. Calculated values for band gaps as a function of the wavelength of the absorption edge (where 1 eV=8065 $cm^{-1}$ can be used as a conversion factor) are as follows: 2480 nm=0.5 eV; 1240 nm=1 eV; 620 nm=2 eV; 413 nm=3 eV; 310 nm=4 eV; 248 nm=5 eV. The radiation associated with this range of band gaps stretches from the UV to the near IR regions of the electromagnetic spectrum.

TABLE 1

| Band Gap of $SnS_xSe_{1-x}$-1 Materials | |
|---|---|
| Material | Band gap (eV) |
| SnS-1 | 3.06 |
| $SnS_{0.43}Se_{0.57}$-1 | 2.43 |
| $SnS_{0.22}Se_{0.78}$-1 | 2.16 |
| SnSe-1 | 1.91 |

EXAMPLE 3

A reaction mixture was prepared by diluting 5.33 g of tetrapropylammonium (TPAOH) solution (obtained from Aldrich) with 3.71 g of water. To this solution there were added 0.34 g of elemental sulfur and then 0.63 g of tin metal powder. This gave a reaction mixture composition of

The mixture was sealed in a Teflon®-lined stainless steel pressure vessel and heated in an oven at 150° C., under autogenous pressure, for 3 days. Product crystals, up to 1 mm in length, were recovered by filtration, washed well and dried under ambient condition. X-ray powder diffraction analysis indicated the identity of the product to be SnS-3(a) by comparison with powder XRD data from U.S. Pat. No. 4,880,761.

EXAMPLE 4

The effect of the concentration of the organic templating agent on the band gap was determined by taking a tin sulfide nanoporous material prepared according to Example 20 of U.S. Pat. No. 4,880,761 using t-butylamine as the templating agent. This material had the structure SnS-1. Removal of the organic cation was carried out at 50° C. for 3 hours and 120° C. for 5 hours. UV reflectance spectroscopy (as described in Example 2) was used to measure the bandgaps of the materials, without exposure to air. It was observed that the band gap as evidenced by the absorption edge in the UV spectrum decreased by 10 and 30 nm respectively for the two treatments.

EXAMPLE 5

TMA-SnSE-1 was prepared as per Example 2. A ¼ inch tube of 99.8% pure $Al_2O_3$ was used as a substrate for depositing the TMA SnSe-1. Two shallow grooves, 1 mm apart were cut into the tubes and 25 mil gold wires were wrapped tightly around the grooves. A slurry of the TMA-SnSe-1 in acetone was prepared and applied to the substrate tubes until a thickness of 1 mm was obtained. The conductivity of the sample was measured using the two probe dc conductivity method in which a constant voltage or current is impressed across the sample and voltage across and current through the sample are measured.

Figure 2:
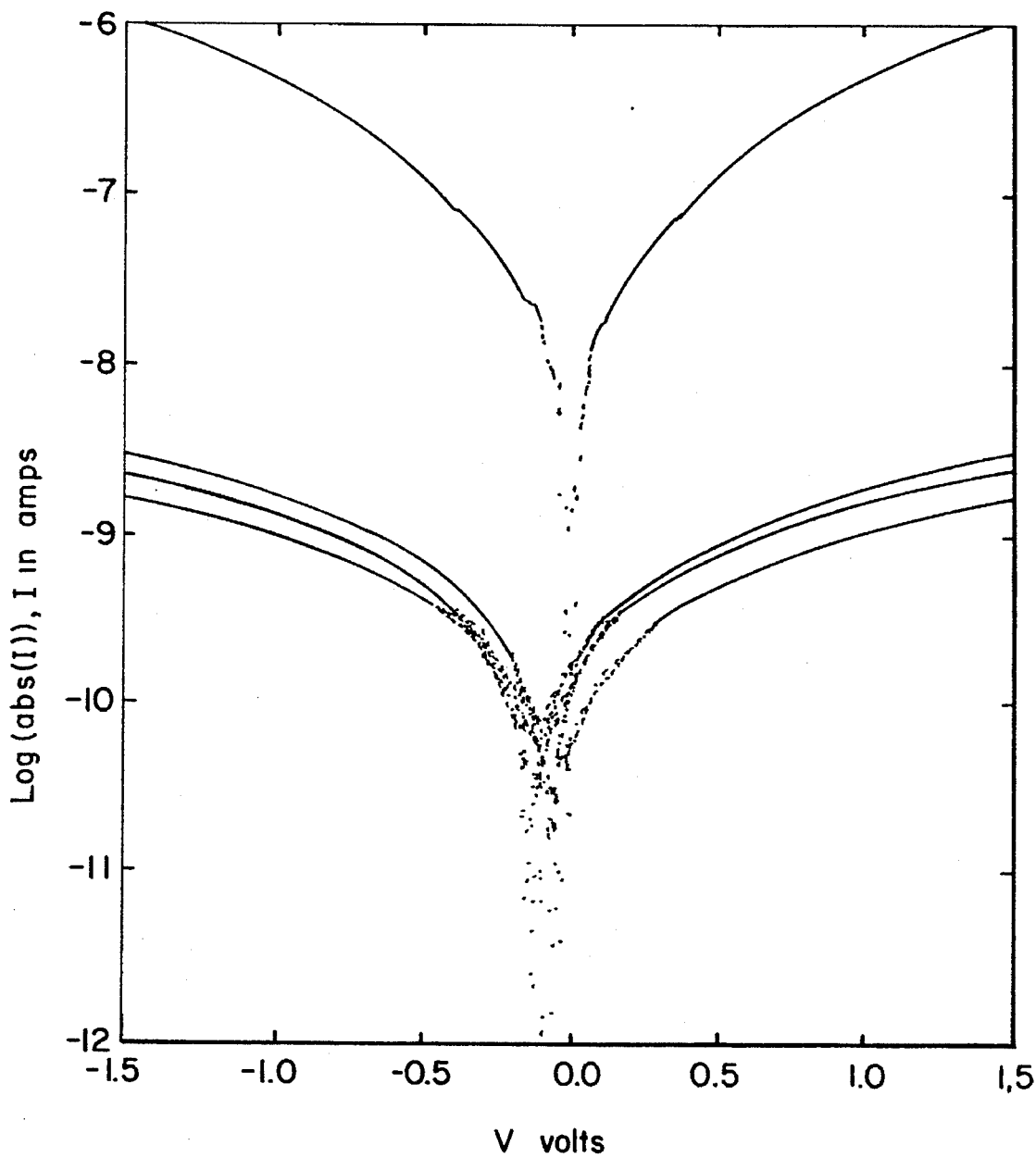
FIG. 2 presents plots of current versus voltage for TMA-SnSe-1.

Using this technique, a sample of TMA-SnSe-1 was tested. First the sample was heated to 100° C. in dry argon for several hours and then cooled to 25° C. Argon saturated with 3% water was introduced into the sample chamber and the I-V behavior monitored as a function of time. Plots of log (abs(I)) versus volts, V, where I is current in amps, are presented in FIG. 2. The plots show an increase in conductivity with time as evidenced by increasing or higher currents with the lapse of time. It appears that two separate phenomena may be responsible for the observed changes. The changes during the initial time period may be owing to the adsorption of water molecules in the pores of the TMA-SnSe-1, while the large changes observed later may be owing to the process of multilayer water deposition on the surface of the sample.

These data show that the nanoporous materials of this invention can adsorb molecular species, which adsorption produces an electrical change in the material.

We claim as our invention:

1. A semiconductor device comprising at least one p-n junction, said junction formed from a "p" semiconductor contacting an "n" semiconductor, where the "p" semiconductor is a nanoporous semiconducting crystalline material having a crystallographically ordered nanoporous framework structure, an intracrystalline pore system whose pores have an average pore diameter of about 2.5 to about 30 Å and a band gap of greater than zero to about 5 eV said material selected from the group consisting of a metal sulfide or selenide having an empirical formula expressed in molar ratios: $xR:MA_{2\pm0.2}:zH_2O$ where x has a value of greater than 0 to about 1.0, R represents at least one organic structure-directing agent present in the intracrystalline pore system, M is germanium, tin, or combinations thereof, A is sulfur, selenium, or combinations thereof, z has a value of about 0 to about 4.0; a metal sulfide or selenide having an empirical formula of $xR:M_{1-y}M'_yA_{2\pm0.2}:zH_2O$ where x has a value of greater than 0 to about 1.0, R represents at least one organic structure-directing agent present in the intracrystalline pore system, M is germanium, tin, or combinations thereof, y varies from greater than 0 to about 0.5, M' is a metal selected from the group consisting of thallium, silver, lead, mercury, chromium, arsenic, antimony, indium, molybdenum, tungsten, cobalt, zinc, copper, manganese, iron, nickel, cadmium and gallium, A is sulfur, selenium, or combinations thereof, z has a value of about 0 to about 4.0; and a metal oxysulfide composition having an empirical formula of $$(M''_sAl_tP_uSi_v)S_wO_{2-w}$$

where M" is selected from the group consisting of cobalt, tin, zinc, iron, chromium, manganese, germanium, gallium and arsenic, s varies from greater than zero to about 1, t varies from 0 to less than 0.5, u varies from 0 to about 0.5, v varies from 0 to less than 0.5, w varies from greater than zero to about 2s and t, u and v are chosen such that when t is greater than zero, u is greater than zero and s+t+u+v=1 and the "n" semiconductor is a conventional semiconductor selected from the group consisting of silicon, germanium, a III-V semiconductor and a II-VI semiconductor.

2. The device of claim 1 where the nanoporous material is a metal sulfide or selenide having the empirical formula $xR:MA_{2\pm0.2}:zH_2O$.

3. The device of claim 1 where the nanoporous material is a metal sulfide or selenide having the empirical formula $xR:M_{1-y}M'yA_{2\pm0.2}:zH_2O$.

4. The device of claim 1 where the nanoporous material is a metal oxysulfide composition having the empirical formula $(M''_sAl_tP_uSi_v)S_wO_{2-w}$.

5. A semiconductor device comprising at least one p-n junction, said junction formed from a "p" semiconductor contacting an "n" semiconductor, where the "n" semiconductor is a nanoporous semiconducting crystalline material having a crystallographically ordered noneporous framework structure, an intracrystalline pore system whose pores have an average pore diameter of about 2.5 to about 30 Å and a band gap of greater than zero to about 5 eV said material selected from the group consisting of a metal sulfide or selenide having an empirical formula expressed in molar ratios: $XR:MA_{2\pm0.2}:zH_2O$ where x has a value of greater than 0 to about 1.0, R represents at least one organic structure-directing agent present in the intracrystalline pore system, M is germanium, tin, or combinations thereof, A is sulfur, selenium, or combinations thereof, z has a value of about 0 to about 4.0; a metal sulfide or selenide having an empirical formula of $xR:M_{1-y}M'_yA_{2\pm0.2}:zH_2O$ where x has a value of greater than 0 to about 1.0, R represents at least one organic structure-directing agent present in the intracrystalline pore system, M is germanium, tin, or combinations thereof, y varies from greater than 0 to about 0.5, M' is a metal selected from the group consisting of thallium, silver, lead, mercury, chromium, arsenic, antimony, indium, molybdenum, tungsten, cobalt, zinc, copper, manganese, iron, nickel, cadmium and gallium, A is sulfur, selenium, or combinations thereof, z has a value of about 0 to about 4.0; and a metal oxysulfide composition having an empirical formula of $$(M''_sAl_tP_uSi_v)S_wO_{2-w}$$

where M" is selected from the group consisting of cobalt, tin, zinc, iron, chromium, manganese, germanium, gallium and arsenic, s varies from greater than zero to about 1, t varies from 0 to less than 0.5, u varies from 0 to about 0.5, v varies from 0 to less than 0.5, w varies from greater than zero to about 2s and t, u and v are chosen such that when t is greater than zero, u is greater than zero and s+t+u+v=1 and the "p" semiconductor is a conventional semiconductor selected from the group consisting of silicon, germanium, a III-V semiconductor and a II-VI semiconductor.

6. The device of claim 5 where the nanoporous material is a metal sulfide or selenide having the empirical formula $xR:MA_{2\pm0.2}:zH_2O$.

7. The device of claim 5 where the nanoporous material is a metal sulfide or selenide having the empirical formula $xR:M_{1-y}M'yA_{2\pm0.2}:zH_2O$.

8. The device of claim 5 where the nanoporous material is a metal oxysulfide composition having the empirical formula $(M''_sAl_tP_uSi_v)S_wO_{2-w}$.

9. A semiconductor device comprising at least one p-n junction, said junction formed from a "p" semiconductor contacting an "n" semiconductor, where each of said "p" and "n" semiconductor is a nanoporous semiconducting crystalline material having a crystallographically ordered nanoporous framework structure, an intracrystalline pore system whose pores have an average pore diameter of about 2.5 to about 30 Å and a band gap of greater than zero to about 5 eV said material selected from the group consisting of a metal sulfide or selenide having an empirical formula expressed in molar ratios: $xR:MA_{2\pm0.2}:zH_2O$ where x has a value of greater than 0 to about 1.0, R represents at least one organic structure-directing agent present in the intracrystalline pore system, M is germanium, tin, or combinations thereof, A is sulfur, selenium, or combinations thereof, z has a value of about 0 to about 4.0; a metal sulfide or selenide having an empirical formula of $xR:M_{1-y}M'_yA_{2\pm0.2}:zH_2O$ where x has a value of greater than 0 to about 1.0, R represents at least one organic structure-directing agent present in the intracrystalline pore system, M is germanium, tin, or combinations thereof, y varies from greater than 0 to about 0.5, M" is a metal selected from the group consisting of thallium, silver, lead, mercury, chromium, arsenic, antimony, indium, molybdenum, tungsten, cobalt, zinc, copper, manganese, iron, nickel, cadmium and gallium, A is sulfur, selenium, or combinations thereof, z has a value of about 0 to about 4.0; and a metal oxysulfide composition having an empirical formula of $$(M''_s Al_t P_u Si_v)S_w O_{2-w}$$

where M" is selected from the group consisting of cobalt, tin, zinc, iron, chromium, manganese, germanium, gallium and arsenic, s varies from greater than zero to about 1, t varies from 0 to less than 0.5, u varies from 0 to about 0.5, v varies from 0 to less than 0.5, w varies from greater than zero to about 2s and t, u and v are chosen such that when t is greater than zero, u is greater than zero and s+t+u+v=1.

10. The device of claim 9 where the nanoporous material is a metal sulfide or selenide having the empirical formula $xR:MA_{2\pm0.2}:zH_2O$.

11. The device of claim 9 where the nanoporous material is a metal sulfide or selenide having the empirical formula $xR:M_{1-y}M'yA_{2\pm0.2}:zH_2O$.

12. The device of claim 9 where the nanoporous material is a metal oxysulfide composition having the empirical formula $(M''_s Al_t P_u Si_v)S_w O_{2-w}$.

* * * * *

UNITED STATES PATENT AND TRADEMARK OFFICE
CERTIFICATE OF CORRECTION

PATENT NO: 5,594,263
DATED: 1/14/97
INVENTORS: Bedard et al.

It is certified that error appears in the above-identified patent and that said Letters Patent is hereby corrected as shown below:

In column 11, line 42 change "SI" to —Si—.

Signed and Sealed this

Twenty-fifth Day of March, 1997

*Attest:*

BRUCE LEHMAN

*Attesting Officer*     Commissioner of Patents and Trademarks